United States Patent
Lenz et al.

(10) Patent No.: US 9,203,118 B2
(45) Date of Patent: Dec. 1, 2015

(54) CAPACITIVE COMMUNICATION LAYER FOR CELL INTEGRATED BATTERY MANAGEMENT SYSTEM

(71) Applicant: GM GLOBAL TECHNOLOGY OPERATIONS LLC, Detroit, MI (US)

(72) Inventors: Jochen Lenz, Hattersheim (DE); Jonas Hemsen, Frankfurt am Main (DE); Peter Andres, Ginsheim-Gustavsburg (DE); Manfred Herrmann, Ginsheim-Gustavsburg (DE)

(73) Assignee: GM Global Technology Operations LLC, Detroit, MI (US)

( * ) Notice: Subject to any disclaimer, the term of this patent is extended or adjusted under 35 U.S.C. 154(b) by 435 days.

(21) Appl. No.: 13/859,641

(22) Filed: Apr. 9, 2013

(65) Prior Publication Data
US 2014/0302352 A1    Oct. 9, 2014

(51) Int. Cl.
*H01M 2/20* (2006.01)
*H01M 2/22* (2006.01)
(Continued)

(52) U.S. Cl.
CPC ......... *H01M 10/4257* (2013.01); *G01R 31/362* (2013.01); *G01R 31/3689* (2013.01); *H01M 10/4264* (2013.01); *H01M 10/482* (2013.01); *H01M 10/6551* (2015.04); *H04Q 9/00* (2013.01); *G01R 31/3658* (2013.01); *H01M 2/20* (2013.01); *H01M 2/202* (2013.01); *H01M 2/206* (2013.01); *H01M 2/22* (2013.01); *H01M 2/26* (2013.01); *H01M 10/0525* (2013.01); *H01M 12/02* (2013.01); *H01M 14/00* (2013.01); *H02J 7/0014* (2013.01); *H04Q 2209/30* (2013.01); *Y02T 10/7011* (2013.01)

(58) Field of Classification Search
CPC ............... H01M 10/6551; H01M 10/4257; H01M 10/482; H01M 10/4264; H01M 10/0525; H01M 2/20; H01M 2/202; H01M 2/206; H01M 2/22; H01M 2/26; H01M 12/02; H01M 14/00
See application file for complete search history.

(56) References Cited

U.S. PATENT DOCUMENTS 5,656,915 A * 8/1997 Eaves .............................. 320/118
2003/0044689 A1* 3/2003 Miyazaki et al. ............. 429/320
(Continued)

FOREIGN PATENT DOCUMENTS

EP     2063279 A1 *  5/2009  ............. G01R 31/36

OTHER PUBLICATIONS http:/www.batterien-entwicklerforum.de/programm.html, Session 7, Abstract, "Dezentrales Batterie Monitoring Konzept mit kapazitiv gekoppeltem Datenbus"; Mar. 14, 2013.

*Primary Examiner* — Kenneth Douyette
(74) *Attorney, Agent, or Firm* — John A. Miller; Miller IP Group, PLC (57) ABSTRACT

A battery module that includes a plurality of battery cells having cell elements that are electrically coupled. Each cell includes a first capacitor plate pair having a first capacitor plate and a second capacitor plate at a first side of the cell element. Each cell also includes a second capacitor plate pair having a first capacitor plate and a second capacitor plate positioned at a second side of the cell element. The first capacitor plate at the second side of one cell element is capacitively coupled to the first capacitor plate at the first side of the cell element in an adjacent cell and the second capacitor plate at the second side of the one cell element is capacitively coupled to the second capacitor plate at the first side of the cell element in the adjacent cell so as to provide DC breaking.

20 Claims, 4 Drawing Sheets

(51) Int. Cl.

| | | |
|---|---|---|
| *H01M 2/26* | (2006.01) | |
| *H01M 10/02* | (2006.01) | |
| *H01M 10/36* | (2010.01) | |
| *H01M 10/42* | (2006.01) | |
| *H01M 10/48* | (2006.01) | |
| *H04Q 9/00* | (2006.01) | |
| *G01R 31/36* | (2006.01) | |
| *H01M 10/6551* | (2014.01) | |
| *H01M 12/02* | (2006.01) | |
| *H01M 14/00* | (2006.01) | |
| *H01M 10/0525* | (2010.01) | |
| *H02J 7/00* | (2006.01) | |

(56) References Cited

U.S. PATENT DOCUMENTS

| | | | |
|---|---|---|---|
| 2005/0218900 A1* | 10/2005 | Iwabuchi et al. | 324/426 |
| 2007/0257640 A1* | 11/2007 | McClure | 320/132 |
| 2008/0284444 A1* | 11/2008 | Li et al. | 324/430 |
| 2009/0260668 A1* | 10/2009 | Maeda | 136/205 |
| 2010/0116570 A1* | 5/2010 | Sugawara et al. | 180/65.1 |

* cited by examiner

CAPACITIVE COMMUNICATION LAYER FOR CELL INTEGRATED BATTERY MANAGEMENT SYSTEM

BACKGROUND OF THE INVENTION

1. Field of the Invention

This invention relates generally to an electrical device for providing a data communications link between an electronic monitoring unit associated with each cell in a battery module and a battery system manager (BSM) and, more particularly, to an electrical device that provides capacitive coupling through integrated metal foils in each cell in a battery module to provide a data communications link between the integrated electronic monitoring unit in adjacent cells and a BSM.

2. Discussion of the Related Art

Electric vehicles are becoming more and more prevalent. These vehicles include hybrid vehicles, such as the extended range electric vehicles (EREV), that combine a battery and a main power source, such as an internal combustion engine, fuel cell system, etc., and electric only vehicles, such as the battery electric vehicles (BEV). These batteries can be different battery types, such as lithium-ion, nickel metal-hydride, lead-acid, etc. A typical high voltage battery system for an electric vehicle may include several battery cells electrically coupled in series to provide the vehicle power and energy requirements. The battery cells may be grouped into battery modules, where each module may include a certain number of cells, and where the cells in a module are electrically coupled in series and/or parallel. The number of cells in a module and the number of modules in a vehicle depends on battery technology and application. For example, for Li-Ion type battery modules it is common use to have twelve cells in series in a module. Different vehicles may have different battery designs that employ various trade-offs and advantages for a particular application.

As a result of many factors, such as cell self-discharge rate, internal cell resistance, electrical connections, battery aging, etc., the state-of-charge (SOC) of the cells in the battery may drift apart during operation of the battery over time. A battery management system (BSM) may be provided to monitor the voltage thresholds, impedance, state-of-health and state-of-charge of each battery cell and the temperature of the battery, and control how much the battery can be charged and discharged based on the state-of-charge of the maximum charged cell and the minimum charged cell. The battery cannot be used to provide power if the cell with the lowest state-of-charge drops below some minimum state-of-charge because that cell may become damaged, and the battery cannot be over-charged beyond some maximum state-of-charge for the cell with the highest state-of-charge because that cell may become overheated and damaged. Thus, a cell with a low state-of-charge may prevent the battery from being used even though the other cells may have a suitable or significant state-of-charge.

In one known vehicle battery design, each battery module includes a cell sensing board (CSB), where each cell in the module is electrically coupled to the CSB by an analog wire. The CSB receives analog voltage signals from each battery cell in the module and uses filtering circuits, multiplexers, analog-to-digital (A/D) converters, etc. to send the voltage signals on a digital wired communications link to the BSM. Because each cell in the battery modules has a voltage potential, such as 3-4 volts, a DC voltage shift occurs from one battery cell to an adjacent battery cell along the communications link as a result of that potential difference. It is known in the art to provide capacitors or transformers between two electrical connections to prevent DC current flow from one side of the capacitor to the other. Typically, an electrical twisted-pair of wires is provided in the communications link between the CSBs that include the capacitors or transformers that provide DC breaking so only the digital signals pass across the capacitor.

A new battery design has been investigated that eliminates the need for the CSBs in each battery module. Particularly, it has been proposed in the art to provide what are sometimes referred to as "smart cells" that include a low cost electronic monitoring unit integrated into the cell that includes electronics for monitoring the voltage and temperature of the cell, and to control the state-of-charge of individual cells by by-passing the cells using a switched resistor, also known as "passive balancing." Particularly, each battery cell is equipped with an integrated electronic circuit that is part of the cell structure itself. Each electronic monitoring unit in each smart cell is part of the communications link from one cell to the next cell known as a chain topology so that the signals from each cell can be sent to the BSM. However, providing a capacitor, a connector and a twisted wire pair for each monitoring unit in the smart cell along the communications link is somewhat infeasible because of the number of connections that would be required.

SUMMARY OF THE INVENTION

In accordance with the teachings of the present invention, a battery module is disclosed that includes a plurality of battery cells having cell elements that are electrically coupled along a power line and an electronic monitoring unit that are electrically coupled along a communications link. Each cell includes a first capacitor plate pair, having a first capacitor plate and a second capacitor plate at a first side of the cell element, where the first capacitor plate pair is electrically coupled to the control unit and is electrically isolated from the cell element. Each cell also includes a second capacitor plate pair, having a first capacitor plate and a second capacitor plate positioned at a second side of the cell element, where the second capacitor plate pair is electrically coupled to the control unit and is electrically isolated from the cell element. The first capacitor plate at the second side of one cell element is capacitively coupled to the first capacitor plate at the first side of the cell element in an adjacent cell and the second capacitor plate at the second side of the one cell element is capacitively coupled to the second capacitor plate at the first side of the cell element in the adjacent cell so as to provide DC breaking along the communications link.

Additional features of the present invention will become apparent from the following description and appended claims, taken in conjunction with the accompanying drawings.

DETAILED DESCRIPTION OF THE EMBODIMENTS

The following discussion of the embodiments of the invention are directed to an electrical circuit that provides capacitive coupling through integrated metal foils to provide a data communications link between an integrated electronic monitoring unit in each cell of a battery module and a BSM is merely exemplary in nature, and is in no way intended to limit the invention or its applications or uses. For example, the electrical circuit described herein has particular application for battery cells in a high voltage vehicle battery. However, as well be appreciated by those skilled in the art, the electrical circuit described herein may have other applications.

Figure 1:
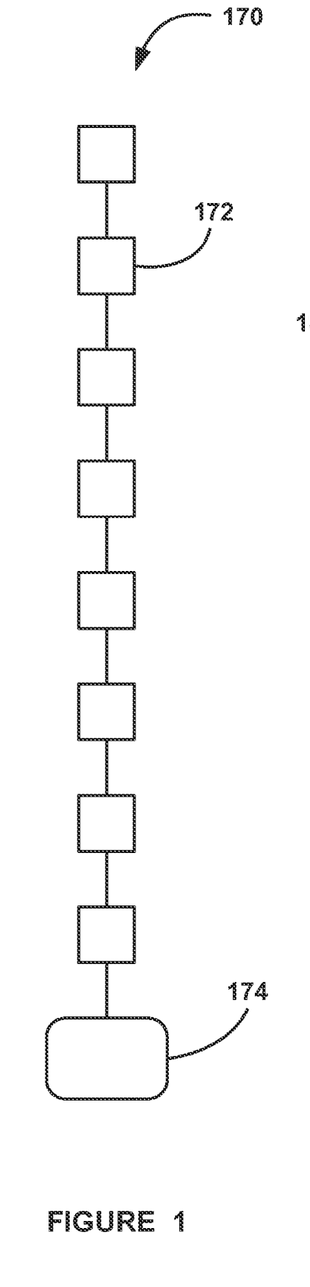
FIG. 1 is an illustration of a battery module chain topology.
Figure 2:
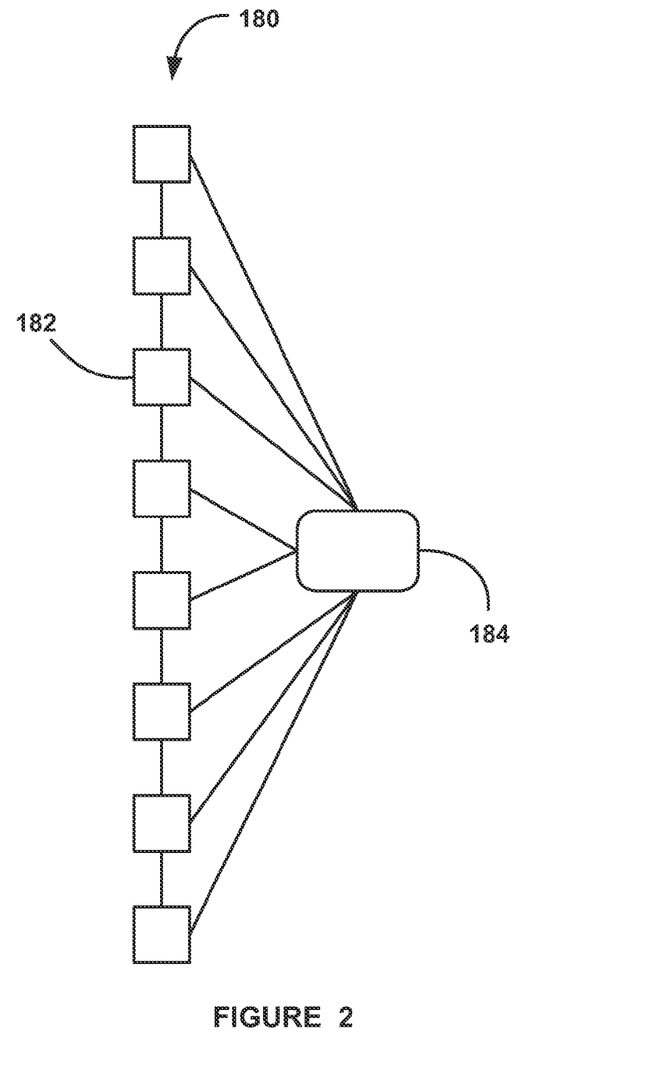
FIG. 2 is an illustration of a battery module star topology.

As will described in detail below, the present invention provides a communications link in a battery module including battery cells. The described communications link topology has a "chain" topology, which means that information is routed through all nodes, as opposed to a "star" topology, where all nodes would have a direct point-to-point connection to the BSM. The difference between a chain topology and a star topology is illustrated in FIGS. 1 and 2, where FIG. 1 shows a battery module chain topology 170 including cell modules 172 and a BSM 174 and FIG. 2 shows a battery module star topology 180 including cell modules 182 and a BSM 184.

Figure 3:
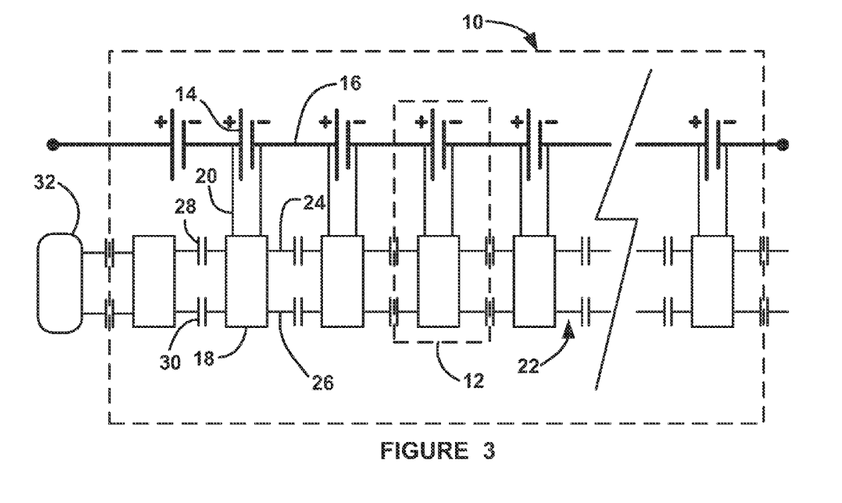
FIG. 3 is a schematic diagram of a battery module including smart cells.

FIG. 3 is a schematic diagram of a battery module 10 including a plurality of battery smart cells 12 where each smart cell 12 includes a cell power element 14 electrically coupled in series to the other cell elements 14 in the other smart cells 12 in the module 10 along an electrical line 16. The battery module 10 can include any suitable number of the smart cells 12, such as twelve smart cells. Further, the cell elements 14 represent the electrical or chemical part of the smart cell 12 that stores the energy, and is intended to represent any suitable element for a high voltage vehicle battery, where examples include lithium-ion, nickel metal-hydride, lead-acid, etc. Each smart cell 12 includes an integrated electronic monitoring unit 18 that can be any electrical board, application specific integrated circuit (ASIC), etc. including components suitable for the purposes discussed herein. The electronic monitoring circuit 18 monitors the voltage of the cell element 14 provided on analog wires 20.

Each monitoring unit 18 is in communication with the monitoring unit 18 in an adjacent cell 12 along a communications link 22 including communications lines 24 and 26, where the lines 24 and 26 allow digital signal flow for the data being provided to and received from the units 18. Each smart cell 12 includes one plate of a capacitor 28 in the line 24 and one plate of a capacitor 30 in the line 26 that provide the DC breaking necessary because of the difference in voltage potential provided by the cell elements 14 in a manner that is well understood by those skilled in the art. The communications link 22 is coupled to a BSM 32 outside of the battery module 10 that receives, processes and transmits digital signals along the lines 24 and 26 to receive and process voltage signals from the cell elements 14 and to provide commands form the BSM 32 to the monitoring units 18.

As discussed above, providing integrated smart cells in a battery module has been proposed in the art to improve the cost, reliability, performance, etc. of the battery module. The traditional way for electrically coupling the capacitors 28 and 30 within the cell 12 would be to provide a separate electrical capacitor component and connect the capacitors 28 and 30 to the lines 24 and 26 by a wire through connectors. The present invention proposes a more cost effective and reduced complexity approach for integrating the capacitors 28 and 30 into the smart cells 12 that includes using capacitive coupling. The proposed approach provides a number of benefits, such as reduced cabling complexity, eliminated risk of connector failure, minimized risk of electrical hazard, and a minimized EMC exposure.

Figure 4:
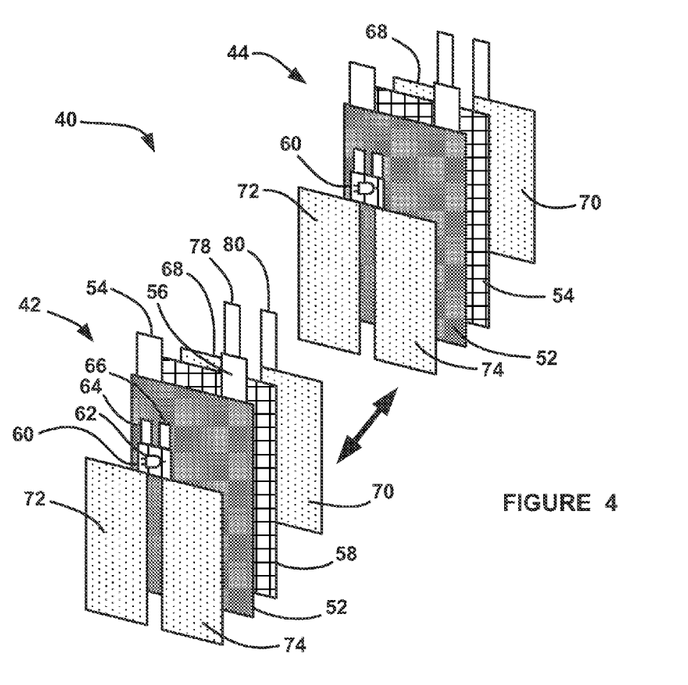
FIG. 4 is an exploded perspective view showing two adjacent smart cells in a battery module that include capacitor plates providing capacitive coupling between the cells along a data communications link.
Figure 5:
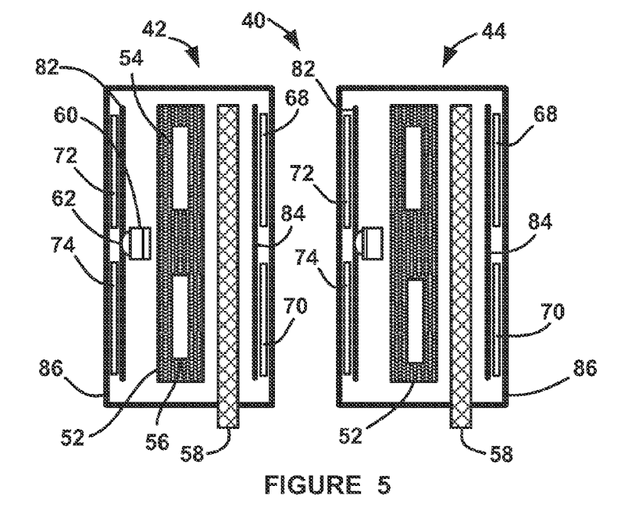
FIG. 5 is a top view of the adjacent smart cells shown in FIG. 4.
Figure 6:
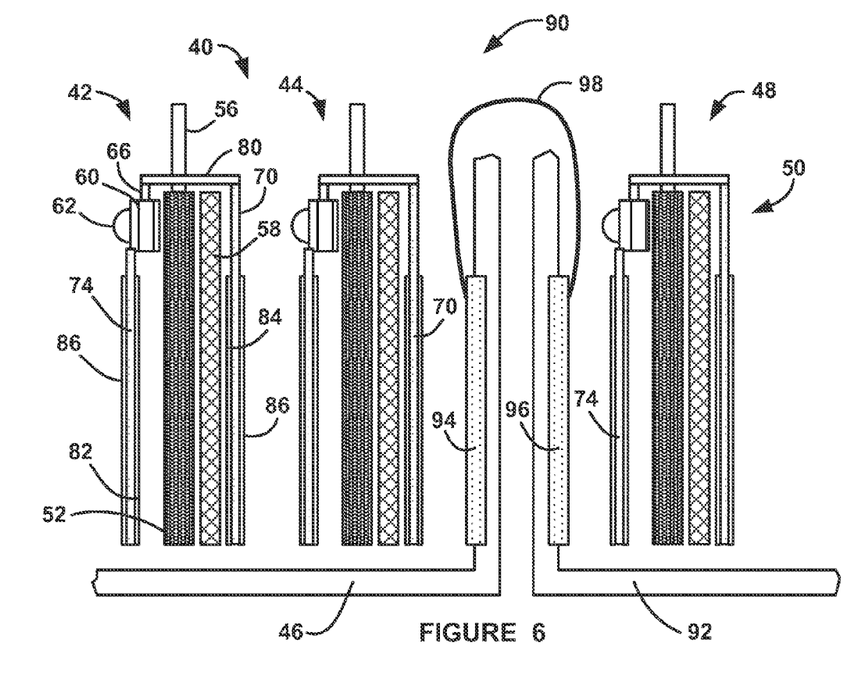
FIG. 6 is a side view of the adjacent smart cells in one battery module and being electrically coupled to a smart cell in an adjacent battery module.

FIG. 4 is an exploded perspective view of a portion of a battery module 40 including portions of adjacent smart cells 42 and 44. The discussion below of the elements in the smart cells 42 and 44 will generally be specific to only the smart cell 42 with the understanding that the smart cell 44, and all of the other smart cells in the battery module 40, include the same elements. FIG. 5 is a top view of the portion of the battery module 40 including the two smart cells 42 and 44 and showing outer mantels. FIG. 6 is a side view of the portion of the battery module 40 including part of an outer module housing 46 and being adjacent to a portion of a second battery module 48 including a smart cell 50. The various structural elements of the smart cells 42 and 44 discussed herein are generally shown in FIGS. 4-6 as having a space therebetween. It is noted that this is merely for clarity purposes in that the various components in the smart cells 42 and 44 are generally tightly packed and in contact with each other often assembled under a compressive pressure, including the smart cells 42 and 44 themselves being in contact with each other.

The smart cell 42 includes a cell element 52 that provides the chemistry and power of the cell 42, and which can be any suitable cell element that provides electricity, such as a lithium-ion pouch cell well known to those skilled in the art. It is stressed, however, that the chemistry of the smart cell 42 does not limit the invention as discussed herein. The cell element 52 includes a positive terminal 54 and a negative terminal 56 that are used to provide the electrical connection (not shown) from one smart cell to the adjacent smart cell in series along the line 16 shown in FIG. 3. A cooling fin 58 is positioned against one side of the cell element 52, and provides a heat sink for drawing away heat from the cell element 52 during operation of the battery module 40. The cooling fin 58 can be any thermal device, such as an aluminum plate, suitable for the purposes discussed herein. In some battery designs, heat may be provided to the smart cell 42, such as during cold vehicle starts, to bring the battery up to temperature more quickly for performance reasons.

The smart cell 42 includes an electronic monitoring unit 60, such as an ASIC, that includes the various circuitry and devices 62 for monitoring the cell voltage would be well understood by those skilled in the art. The monitoring unit 60 also includes electrical terminals 64 and 66 for providing an electrical connection for the communications link 22 as will be discussed in more detail below. The smart cell 42 includes four capacitor plates that are configured as metal films or foils, such as an aluminum foil, having a thickness of about 0.1 mm. Particularly, the smart cell 42 includes a pair of capacitor plates 68 and 70 on one side of the cell element 52 adjacent to the cooling fin 58 and another pair of capacitor plates 72 and 74 adjacent to and at the other side of the cell element 52 from the capacitor plates 68 and 70. The pair of the capacitor plates 68 and 70 provides electrical coupling to the cell 44 at one side of the smart cell 42 and the other pair of the capacitor plates 72 and 74 provides electrical coupling to another adjacent smart cell (not shown) at the other side of the smart cell 42. The capacitor plates 72 and 74 are positioned adjacent to the monitoring unit 60 and are electrically coupled thereto. The capacitor plate 68 includes an extended terminal 78 and the capacitor plate 70 includes an extended terminal 80. The terminal 78 makes electrical contact with the terminal 64 and the terminal 80 makes electrical contact with the terminal 66. These electrical connections are not specifically shown in FIGS. 4 and 5. In one non-limiting example, as shown in FIG. 6, this electrical connection is provided by folding the terminal 78 across the cooling fin 58 and the cell element 52 so that it makes electrical contact with the terminal 64. Likewise, the terminal 80 is folded over the cooling fin 58 and the cell element 52 to make electrical contact with the terminal 66. Most likely, the metal foils 68 and 70, the terminals 78 and 80 and the terminals 64 and 66 are one part, and just folded, so that they all are positioned correctly.

The capacitor plates 68-74 need to be electrically isolated from the adjacent conductors. This electrical isolation is not specifically shown in FIG. 4. However, as shown in FIGS. 5 and 6, an insulating layer 82, such as a plastic layer, is provided between the capacitor plates 72 and 74 and the cell element 52. Further, an insulating layer 84 electrically isolates the capacitor plates 68 and 70 from the cooling fin 58. An outer insulative mantle 86 is configured around the smart cell 42 and provides electrical isolation between the capacitor plates 68 and 70 in the smart cell 42 and the capacitor plates 72 and 74 in the smart cell 44. The outer mantle 86 also provides electrical isolation between the capacitor plates 72 and 74 in the smart cell 42 and the capacitor plates 68 and 70 that would be in the adjacent smart cell at this side of the smart cell 42. Although not specifically shown in FIGS. 4 and 6, the outer mantle 86 is positioned in direct contact with the outer mantle 86 of the adjacent cell such that there is not a gap therebetween.

The capacitive coupling between the capacitor plate 68 in the smart cell 42 and the capacitor plate 72 in the smart cell 44 define a capacitor, such as one of the capacitors 28 in the communications line 24. Likewise, the capacitive coupling between the capacitor plate 70 in the smart cell 42 and the capacitor plate 74 in the smart cell 44 define one of the capacitors 30 in the other communications line 26. The distance between the plates 68 and 72 and the plates 70 and 74 is selected to provide the desired capacitance and DC breaking necessary for the digital signal flow, and is defined by the thickness of the mantels 86 in the smart cells 42 and 44. In one non-limiting example, that distance is typically less than 0.1 mm, resulting in a capacity value typically of 1 nf. The parasitic capacitance created between the capacitor plates 68 and 70 and the cooling fin 58 and the parasitic capacitance created between the capacitor plates 72 and 74 and the cell element 52 needs to be considered in the electrical design of the battery module 40. Thus, it is not necessary to provide wires in the communications lines 20 and 22 for connecting one cell to an adjacent cell.

FIG. 6 shows a portion of a battery 90 that includes the battery module 40 with the smart cells 42 and 44 being positioned adjacent to the battery module 48 including the smart cell 50 that also includes the capacitor plates discussed above. The battery module 40 includes the outer housing 46 and the battery module 48 includes an outer housing 92. A capacitor plate 94 is provided at an end of the housing 46 to be capacitively coupled to the plate 70 in the last smart cell at the end of the module 40. Likewise, a capacitor plate 96 is provided at an end of the housing 92 to be capacitively coupled to the capacitor plate 74 in the smart cell 50. Electrical lines 98 are connected to the plates 94 and 96 to provide the communications line interconnection between the modules 40 and 48. Although not specifically shown, another capacitor plate would be provided at the end of the housing 46 to be capacitively coupled to the plate 68 in the last smart cell at the end of the module 40 and another capacitor plate would be provided at the end of the housing 92 to be capacitively coupled to the capacitor plate 72 in the smart cell 50.

As mentioned above, the communications link 22 between the smart cells in the battery modules includes both the lines 24 and 26. Different communications schemes are known in the art where both communications directions can be operated in parallel at the same time, known as full-duplex, or where the digital signals can propagate in both directions only one after the other on the lines 24 and 26, known as half-duplex.

Figure 7:
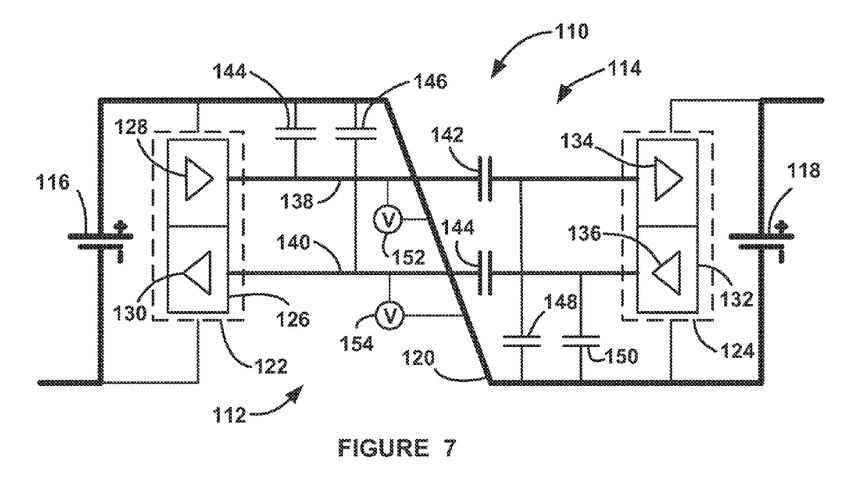
FIG. 7 is a schematic diagram of a full-duplex UART-type capacitive communications layer for a cell integrated battery management system.

FIG. 7 is a schematic diagram of a capacitive communications layer circuit 110 for the full-duplex embodiment that includes two adjacent battery smart cells 112 and 114 including cell elements 116 and 118, respectively, coupled together by a power line 120. The smart cell 112 includes an electronic monitoring unit 122 and the smart cell 114 includes an electronic monitoring unit 124. For the full-duplex circuit 110, the electronic monitoring unit 122 may include a universal asynchronous receiver/transmitter (UART) 126 having a transmitter 128 and a receiver 130 and the electronic monitoring unit 124 may include a UART 132 having a receiver 134 and a transmitter 136. The transmitter 128 transmits the digital signals on a communications line 138 to be received by the receiver 134, where the line 138 represents the communications line 24. The transmitter 136 transmits the digital signals on a communications line 140 to be received by the receiver 130, where the line 140 represents the communications line 26. A capacitor 142 is provided in the line 138 and represents the capacitive coupling between adjacent smart cells as discussed above, and a capacitor 144 is provided in the line 140 and represents the capacitive coupling between the adjacent smart cells. Capacitors 144, 146, 148 and 150 represent the parasitic capacitances referred to above. The power line 120 is needed to provide a ground connection between the monitoring units 122 and 124. For each direction in the lines 138 and 140, there is a dedicated asymmetrical voltage signal 152 and 154, respectively, so that both directions can be operated in parallel at the same time.

Figure 8:
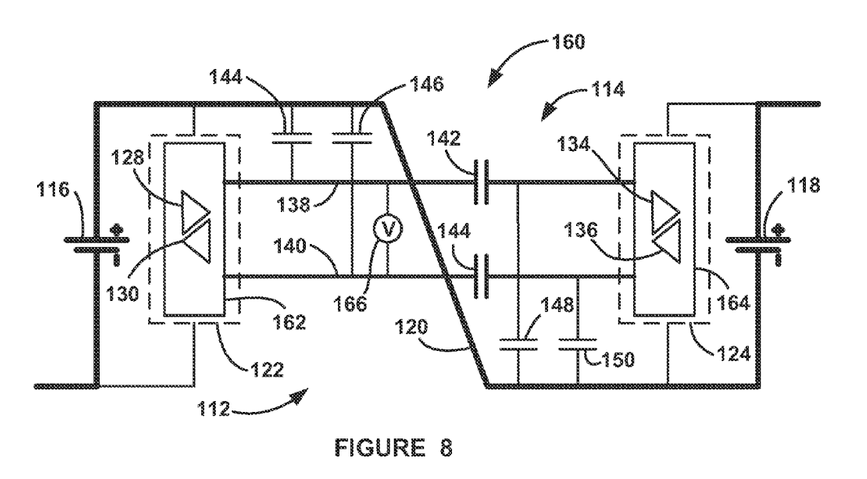
FIG. 8 is a schematic diagram of a half-duplex LVDS-type capacitive communications layer for a cell integrated battery management system.

FIG. 8 is a schematic diagram of a capacitive communications layer circuit 160 for the half-duplex embodiment, where like elements to the circuit 110 are identified by the same reference number. In this embodiment, the UARTs 126 and 136 are replaced by low voltage differential signal (LVDS) devices 162 and 164, respectively. The LVDS devices 162 and 164 include the transmitters and receivers that allow signals to propagate in both directions on the lines 138 and 140 in a manner well understood by those skilled in the art. LVDS signals can propagate without a ground connection if the power line 120 is missing. There is only one symmetrical voltage signal 166 shared for both directions in the lines 138 and 140 so that only one direction can be operated at the same time, where both directions can only be operated on after the other.

As will be well understood by those skilled in the art, the several and various steps and processes discussed herein to describe the invention may be referring to operations performed by a computer, a processor or other electronic calculating device that manipulate and/or transform data using electrical phenomenon. Those computers and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A battery module including a plurality of battery cells coupled together by a power line and a communications link, each battery cell comprising:
    a cell element providing electrical power and being electrically coupled in series by the power line to a cell element in an adjacent cell, said cell element including a first side and a second side;
    an electronic monitoring unit including electronic components for measuring a voltage of the cell element;
    a first capacitor plate pair including a first capacitor plate and a second capacitor plate positioned at the first side of the cell element, said first capacitor plate pair being electrically coupled to the monitoring unit and being electrically isolated from the cell element; and
    a second capacitor plate pair including a first capacitor plate and a second capacitor plate positioned at the second side of the cell element, said second capacitor plate pair being electrically coupled to the monitoring unit and being electrically isolated from the cell element, wherein the first capacitor plate at the second side of the cell element is capacitively coupled to the first capacitor plate at the first side of the cell element in the adjacent cell and the second capacitor plate at the second side of the cell element is capacitively coupled to the second capacitor plate at the first side of the cell element in the adjacent cell, and wherein the capacitive coupling between the capacitor plates provides DC breaking in the communications link.

2. The battery module according to claim 1 wherein all of the capacitor plates are metal foils.

3. The battery module according to claim 2 wherein the first and second capacitor plates in the first capacitor plate pair are directly electrically coupled to the electronic monitoring unit.

4. The battery module according to claim 3 wherein the first capacitor plate and the second capacitor plate in the second capacitor plate pair include extended terminals that are folded over the cell element and are electrically coupled to the electronic monitoring unit.

5. The battery module according to claim 1 wherein each battery cell further comprises a cooling fin positioned between the cell element and the second pair of capacitor plates.

6. The battery module according to claim 1 wherein the cell elements are lithium-ion pouch elements.

7. The battery module according to claim 1 wherein the electronic monitoring unit includes a universal asynchronous receiver/transmitter (UART) that provides a full-duplex communications layer where signal flow is provided in one direction on signal lines in the communications link.

8. The battery module according to claim 1 wherein the electronic monitoring unit includes a low voltage differential signal (LVDS) device that provides a half-duplex communications layer where signal flow is provided in both directions on signal lines in the communications link.

9. The battery module according to claim 1 wherein the battery module is part of a high voltage battery on a vehicle.

10. The battery module according to claim 1 wherein the communications link is electrically coupled to a battery system manager.

11. The battery module according to claim 1 wherein a distance between the first capacitor plate at the second side of the cell element and the first capacitor plate at the first side of the cell element in the adjacent cell and the distance between the second capacitor plate at the second side of the cell element and the second capacitor plate at the first side of the cell element of the adjacent cell is less than 0.1 mm.

12. A high voltage battery for a vehicle, said high voltage battery including a plurality of battery modules each including a plurality of battery cells where the battery cells in all of the modules are coupled together by a power a line and a communications link, each battery cell comprising:
    a cell element providing electrical power and being electrically coupled in series by the power line to a cell element in an adjacent cell element, said cell element including a first side and a second side;
    an electronic monitoring unit positioned at the first side of the cell element and including electronic components that measure a voltage of the cell element;
    a cooling fin positioned at the second side of the cell element and being in contact therewith;
    a first capacitor plate pair including a first capacitor plate and a second capacitor plate positioned at the first side of the cell element, said first capacitor plate being electrically coupled to the monitoring unit and being electrically isolated from the cell element; and
    a second capacitor plate pair including a first capacitor plate and a second capacitor plate positioned adjacent to the cooling fin and opposite to the cell element at the second side of the cell element, said second capacitor plate pair being electrically coupled to the monitoring unit and being electrically isolated from the cooling fin, wherein the first capacitor plate at the second side of the cell element is capacitively coupled to the first capacitor plate at the first side of the cell element of the adjacent cell and the second capacitor plate at the second side of the cell element is capacitively coupled to the second capacitor plate at the first side of the cell element of the adjacent cell, and wherein the capacitive coupling between the capacitor plates provides DC breaking in the communications link.

13. The battery module according to claim 12 wherein all of the capacitor plates are metal foils.

14. The battery module according to claim 13 wherein the first and second capacitor plates in the first capacitor plate pair are directly electrically coupled to the electronic monitoring unit.

15. The battery module according to claim 14 wherein the first capacitor plate and the second capacitor plate in the second capacitor plate pair include extended terminals that are folded over the cell element and are electrically coupled to the electronic monitoring unit.

16. The battery module according to claim 12 wherein a distance between the first capacitor plate at the second side of the cell element and the first capacitor plate at the first side of the cell element in the adjacent cell and the distance between the second capacitor plate at the second side of the cell element and the second capacitor plate at the first side of the cell element of the adjacent cell is less than 0.1 mm.

17. A battery module including a plurality of battery cells coupled together by a power line and a communications link, each battery cell comprising:
- a cell element providing electrical power and being electrically coupled in series along the power line to a cell element in an adjacent cell element, said cell element including a first side and a second side;
- an electronic monitoring unit including electronic components for measuring a voltage of the cell element;
- a first capacitor plate positioned at the first side of the cell element, said first capacitor plate being electrically coupled to the monitoring unit and being electrically isolated from the cell element; and
- a second capacitor plate positioned at the second side of the cell element, said second capacitor plate being electrically coupled to the monitoring unit and being electrically isolated from the cell element, wherein the first capacitor plate at the first side of the cell element is capacitively coupled to the second capacitor plate at the second side of the cell element in the adjacent cell, and wherein the capacitive coupling between the capacitor plates provides DC breaking in of the communications link.

18. The battery module according to claim 17 wherein all of the capacitor plates are metal foils.

19. The battery module according to claim 18 wherein the first capacitor plate is directly electrically coupled to the electronic monitoring unit.

20. The battery module according to claim 19 wherein the second capacitor plate includes an extended terminal that is folded over the cell element and is electrically coupled to the electronic monitoring unit.

* * * * *